(12) United States Patent
Oates et al.

(10) Patent No.: US 7,768,099 B2
(45) Date of Patent: Aug. 3, 2010

(54) MIM CAPACITOR INTEGRATED INTO THE DAMASCENE STRUCTURE AND METHOD OF MAKING THEREOF

(75) Inventors: Anthony Oates, Hsinchu (TW); Carlos H. Diaz, Mountain View, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 620 days.

(21) Appl. No.: 11/525,232

(22) Filed: Sep. 21, 2006

(65) Prior Publication Data

US 2007/0069385 A1    Mar. 29, 2007

Related U.S. Application Data

(63) Continuation-in-part of application No. 11/225,336, filed on Sep. 13, 2005, now abandoned.

(51) Int. Cl.
*H01L 29/00* (2006.01)
(52) U.S. Cl. ............... 257/532; 257/535; 257/E29.343
(58) Field of Classification Search ............ 257/303, 257/306, 532, 535, E29.343, E27.086, E27.087, 257/E27.088
See application file for complete search history.

(56) References Cited

U.S. PATENT DOCUMENTS

| | | | |
|---|---|---|---|
| 6,069,051 A | 5/2000 | Nguyen et al. | |
| 6,083,785 A | 7/2000 | Segawa et al. | |
| 6,140,693 A | 10/2000 | Weng et al. | |
| 6,180,976 B1 | 1/2001 | Roy | |
| 6,259,128 B1 | 7/2001 | Adler et al. | |
| 6,271,084 B1 | 8/2001 | Tu et al. | |
| 6,284,590 B1 | 9/2001 | Cha et al. | |
| 6,284,619 B1 | 9/2001 | Seymour et al. | |
| 6,329,234 B1 | 12/2001 | Ma et al. | |
| 6,358,792 B1 | 3/2002 | Hsue et al. | |
| 6,436,787 B1 | 8/2002 | Shih et al. | |
| 6,472,721 B2 | 10/2002 | Ma et al. | |
| 6,492,226 B1 | 12/2002 | Hsue et al. | |
| 6,500,724 B1 | 12/2002 | Zurcher et al. | |
| 6,559,493 B2 | 5/2003 | Lee et al. | |
| 6,576,525 B2 | 6/2003 | Stamper | |
| 6,677,635 B2 | 1/2004 | Ning et al. | |
| 6,680,542 B1 | 1/2004 | Gibson et al. | |
| 6,706,591 B1 | 3/2004 | Chan et al. | |
| 6,723,600 B2 | 4/2004 | Wong et al. | |
| 6,730,573 B1 | 5/2004 | Ng et al. | |

(Continued)

FOREIGN PATENT DOCUMENTS

JP          2001237375 A        8/2001

(Continued)

*Primary Examiner*—Hoai V Pham
(74) *Attorney, Agent, or Firm*—Slater & Matsil, L.L.P.

(57) ABSTRACT

This invention provides for the integration of metal-insulator-metal (MIM) capacitors with the damascene interconnect structure and process. The method includes forming a damascene interconnect structure and a MIM capacitor damascene structure wherein a diffusion barrier material forms the capacitor electrodes. The method includes forming a MIM capacitor damascene structure through an interlevel dielectric layer and terminating on a diffusion barrier material instead of a conventional dielectric etch stop layer. In alternative embodiments, the integrated damascene MIM capacitor makes up part of semiconductor device such as DRAM memory, CMOS, or a high frequency device.

15 Claims, 5 Drawing Sheets

U.S. PATENT DOCUMENTS

| | | |
|---|---|---|
| 6,746,914 B2 * | 6/2004 | Kai et al. .................... 438/253 |
| 6,787,907 B2 | 9/2004 | Watanabe et al. |
| 6,803,306 B2 | 10/2004 | Tsau |
| 6,825,092 B2 | 11/2004 | Zurcher et al. |
| 6,838,717 B1 | 1/2005 | Yen et al. |
| 7,279,733 B2 | 10/2007 | Lee et al. |
| 2002/0008323 A1 | 1/2002 | Watanabe et al. |
| 2003/0017699 A1 | 1/2003 | Zurcher et al. |
| 2004/0106266 A1 | 6/2004 | Huang et al. |
| 2004/0197991 A1 | 10/2004 | Lee et al. |
| 2004/0201057 A1 | 10/2004 | Lien et al. |
| 2005/0263848 A1 | 12/2005 | Cho |

FOREIGN PATENT DOCUMENTS

| | | |
|---|---|---|
| JP | 2002359292 A | 12/2002 |
| JP | 2004193602 A | 7/2004 |
| TW | 471045 B | 1/2002 |
| TW | 503575 B | 9/2002 |
| TW | 200507108 | 2/2005 |

* cited by examiner

MIM CAPACITOR INTEGRATED INTO THE DAMASCENE STRUCTURE AND METHOD OF MAKING THEREOF

This application is a continuation-in-part of U.S. patent application Ser. No. 11/225,336, entitled "MIM Capacitor Integrated Into the Damascene Structure and Method of Making Thereof," filed on Sep. 13, 2005, now abandoned which application is incorporated herein by reference.

TECHNICAL FIELD

This invention relates generally to semiconductor device fabrication, and more particularly to the integration of metal-insulator-metal (MIM) capacitors with the damascene interconnect structure and process.

BACKGROUND

Capacitors are critical components of analog integrated circuit devices and memory devices. They are also used in many mixed signal or high frequency applications requiring both high performance and high speed. Low series resistance, low loss, high Q and low (RC) time constants are required in these high frequency applications for high performance. Metal-insulator-metal (MIM) capacitors are commonly used, such as in high performance applications.

MIM capacitors typically include metal electrodes separated by a dielectric. The MIM structure and materials frequently and advantageously allow integration of its fabrication with the damascene interconnect process. In conventional methods, the electrodes are made from Al, Cu, or alloys thereof. The thin insulating dielectric layer is usually made from silicon oxide or silicon nitride deposited by chemical vapor deposition (CVD). MIM capacitors offer a number of advantages providing a relatively constant value of capacitance over a relatively wide range of voltages. Conventional MIM capacitors have a relatively small parasitic resistance, however, they also have a number of disadvantages.

Advanced technology applications frequently require a capacitance in excess of 100 nF. Even with an ultra thin gate oxide, high capacitance requires a large silicon area, thereby increasing die size as well as chip and assembly cost. Ultra thin oxides also lead to unacceptably high leakage currents in integrated circuits (e.g. 100 mA for 0.1 mm$^2$ of 12 Å gate oxide). These factors cause problems with power and thermal management, they shorten battery life for mobile applications, and they increase overall cost.

Current MIM capacitor manufacturing methods require a number of photo-lithographic steps to form electrodes and dielectric layers. Since the cross-sectional area of the capacitor plug is small and the difference in height between damascene and capacitor plugs may be great, etching is very difficult to control. If the capacitor metal electrode layers and its dielectric layer are formed on an entire layer during fabrication, production costs are very high. When etching to form the electrodes and dielectric layer, it is very easy to cause damage on the edge portion of the metal capacitor.

The following references provide additional background. In U.S. Pat. No. 6,680,542, Gibson et al. show a metal-on-metal capacitor structure and process and an associated damascene process. In U.S. Pat. No. 6,358,792, Hsue et al. show a method for fabricating a lower capacitor electrode concurrently with an interconnect metal. In U.S. Pat. No. 6,140,693, Weng et al. show a metal capacitor for ultra large-scale integration (ULSI) compatible with the damascene process. In U.S. Pat. No. 6,069,051, Nguyen et al. show a method of fabricating metal-to-metal capacitors using planar processing compatible with the damascene process. In U.S. Pat. No. 6,492,226, Hsue et al. show a method for forming a metal capacitor in a damascene process. In U.S. Pat. No. 6,559,493, Lee et al. show an improved stacked MIM capacitor. In U.S. Pat. No. 6,436,787, Shih et al. show a method for forming a crown MIM capacitor integrated with the damascene process. In U.S. Pat. Pub. No. 2004/0201057, Lien et al. show a method for forming a MIM capacitor in a copper damascene process. However, none of these references describes the novel structure and method of this invention that provides for the integration of specific elements of a MIM capacitor into a damascene fabrication process.

SUMMARY OF THE INVENTION

These and other problems are generally solved or circumvented, and technical advantages are generally achieved, by preferred embodiments of the present invention that provide a method and structure for the creation of a metal-insulator-metal (MIM) capacitor. By using a damascene barrier liner for capacitor plates and an etch stop layer as a capacitor dielectric, fabrication costs are reduced without sacrificing capacitor density or performance.

An embodiment of the invention provides a semiconductor device. A preferred device comprises an interconnect structure such as damascene structure having a conductive via formed through a first interlevel dielectric layer and a first dielectric etch stop layer located under the first interlevel dielectric layer. Preferably, the conductive via contacts a first interconnect structure located under the first dielectric etch stop layer. The structure may further comprise a conductive trench formed through a second interlevel dielectric layer and a second dielectric etch stop layer located between the first and second interlevel dielectric layers. In preferred embodiments, the conductive trench contacts the conductive via.

Further components of the preferred device comprise a first plate electrode formed on a second interconnect structure located under the first dielectric etch stop layer and a second plate electrode formed on the first dielectric etch stop layer and substantially overlapping the first plate electrode. Embodiments further include a second damascene interconnect structure formed through the first and second interlevel dielectric layers and the first dielectric etch stop layer and contacting the second plate electrode. Embodiments of the invention advantageously provide a MIM capacitor integrated with a damascene interconnect structure.

In other embodiments of the invention, a MIM capacitor comprises a first electrode formed on a second interconnect structure, wherein the second interconnect structure is located under a dielectric etch stop layer. Embodiments further comprise a second electrode formed on the dielectric etch stop layer. Preferably, the second plate electrode is substantially parallel to the first plate electrode and substantially overlapping the first plate electrode. Preferred embodiments further include a second interlevel conductive via formed through the interlevel dielectric layer and contacting the second electrode.

Still other embodiments of the invention provide a method of fabricating a MIM capacitor. The method comprises providing a substrate having a first conductive interconnect structure and a second conductive interconnect structure and depositing a first conductive layer of diffusion barrier material over the substrate. The first conductive layer is patterned to form a first capacitor electrode over the second interconnect structure. Preferred embodiments further include forming a first dielectric etch stop layer over the substrate and over the first capacitor electrode. A second conductive layer is formed over the first dielectric etch stop layer, and it is patterned to form a second capacitor electrode located substantially directly above the first capacitor electrode. A first interlevel dielectric layer is formed over the first dielectric etch stop layer and over the second capacitor electrode. A second dielectric etch stop layer is formed over the first interlevel dielectric layer, and a second interlevel dielectric layer is formed over the second dielectric etch stop layer. Preferred embodiments may further comprise forming a first damascene interconnect structure through the first and second interlevel dielectric layers, the second dielectric etch stop layer, and contacting the second capacitor electrode. Preferred embodiments may also further comprise forming a second damascene interconnect structure through the first and second interlevel dielectric layers, the first and second dielectric etch stop layers and contacting the first conductive interconnect structure.

The diffusion barrier and liner materials may comprise TiN, W, Al, Al alloys, ThN, VN, ZrN, CrN, WC, WN, WCN, NbN, AlN, Ni, Co, AlCu alloys, TaN, TiN, Ti, Ta, Ra, Ru, or combinations thereof Preferably, first capacitor electrode and the second capacitor electrode have a maximum dimension greater than or equal to a maximum lateral damascene trench dimension.

Embodiments of this invention advantageously provide for a flexible fabrication process that supports a wide range of application requirements. Embodiments further provide for on-circuit decoupling capacitor applications, since the embodiments' processing requirements are less stringent than precision analog requirements. Fabrication of preferred embodiments require only one additional mask to form the capacitor plates, and it even this step is simplified because the dimensional requirements of the capacitor plates are far less stringent than other device features.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention. The present invention will be described with respect to preferred embodiments in a specific context, namely a copper damascene interconnect process.

Figure 1A:
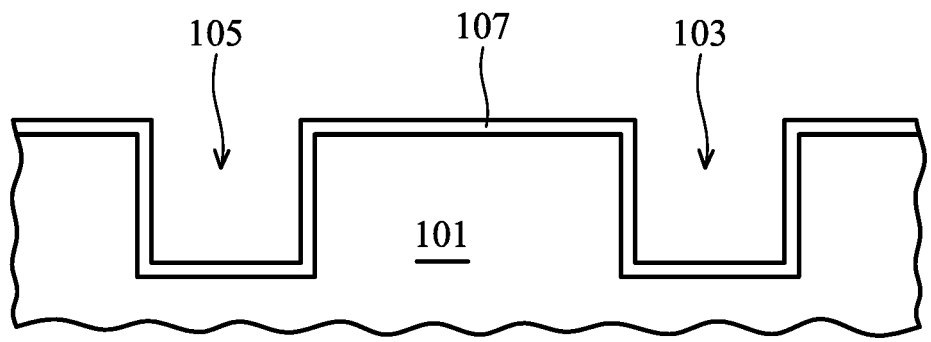
FIGS. 1A to 1D are cross-sectional views of an embodiment of the present invention illustrating an intermediate semiconductor device and the formation of the bottom capacitor electrode.

Turning now to FIGS. 1A through 1D, these figures are cross-sectional views of an embodiment of the present invention illustrating an intermediate semiconductor device and the formation of the first or bottom capacitor electrode as described below. FIG. 1A depicts a cross sectional view of an integrated circuit at an intermediate fabrication stage. Shown in FIG. 1A is a conventional substrate 101, which comprises as a silicon wafer or a silicon on insulator (SOI) structure on which is formed a dielectric such as an interlevel dielectric (ILD), an intermetallic dielectric (IMD), or other dielectric. Substrate 101 includes a first trench opening 103 and a second trench opening 105. The trenches may be formed using conventional photolithographic patterning and anisotropic etching methods.

Referring to FIG. 1A, a barrier layer 107 is conformably, blanket deposited to line at least the trench openings 103 and 105 and at least a portion of the surface of substrate 101 that is adjacent the trench opening. The barrier layer is preferably about 10 to 30 Angstroms thick, and it forms a barrier for Cu diffusion. The barrier layer 107 may include TaN, TiN, WN, ThN, VN, ZrN, CrN, WC, WN, WCN, NbN, AlN, Ni, Co, Al, AlCu alloy, W, Ti, Ta, Ra, Ru, combinations thereof, and alloys thereof. In alternative embodiments the barrier layer 107 is a metal rich nitride, either throughout the bulk or only on the surface.

In alternative embodiments, barrier layer 107 includes a first barrier layer on the surface of the substrate and a second barrier layer on the first barrier layer. The first barrier layer includes an atomic layer deposited (ALD) material such as Ta, W, and combinations thereof. The second barrier layer may comprise the same material as the first barrier layer.

The barrier layer 107 may be applied using physical vapor deposition (PVD), chemical vapor deposition (CVD), plasma enhanced chemical vapor deposition (PECVD), plasma enhanced atomic layer deposition (PEALD), atomic layer deposition (ALD), or other conventional techniques.

Figure 1B:
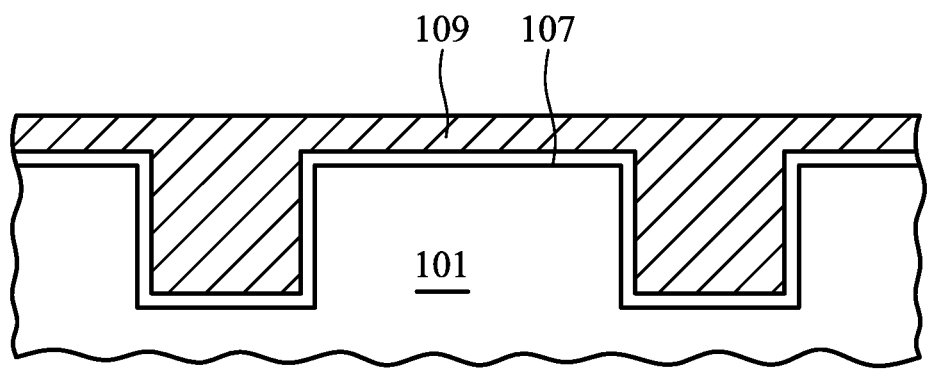

After depositing barrier layer 107, interconnect structures are formed by filling trench openings 103 and 105 with a conductor 109, as shown in FIG. 1B. In other embodiments, a glue layer (not shown) may be interposed between the barrier layer 107 and an overlying conductor 109. The optional glue layer enhances adhesion between adjacent layers. It may be about 10 to 500 Angstroms thick, preferably less than about 150 A. It may be applied using PVD, CVD, PECVD, PEALD, and, preferably, ALD at about 100-300° C. It may consist essentially of Ru, Ta, Ti, W, Co, Ni, Nb, Al, AlCu alloy, and combinations thereof.

An optional Cu seed layer (not shown) may be deposited on the barrier layer 107. Prior to deposition of conductor 109, a seed layer is optionally deposited over the glue layer or barrier layer by, for example, PVD and/or CVD. The seed layer, preferably copper, is PVD deposited to form a continuous layer about 400 to 700 Å thick over the wafer process surface, thereby providing a continuously conductive surface for depositing the bulk of the copper during the subsequent electrochemical deposition (ECD) process.

Still referring to FIG. 1B, a conductor 109, preferably copper, is electroplated according to an ECD process to fill trenches 103 and 105. Although other copper filling methods such as PVD and CVD methods may be used, electroplating (electrode-position) is preferred because of its superior gap-filling and step coverage. Alternative embodiments may include a conductor 109 consisting of Cu, Al, Au, or Ag, and combinations thereof, or alloyed compositions thereof.

Figure 1C:
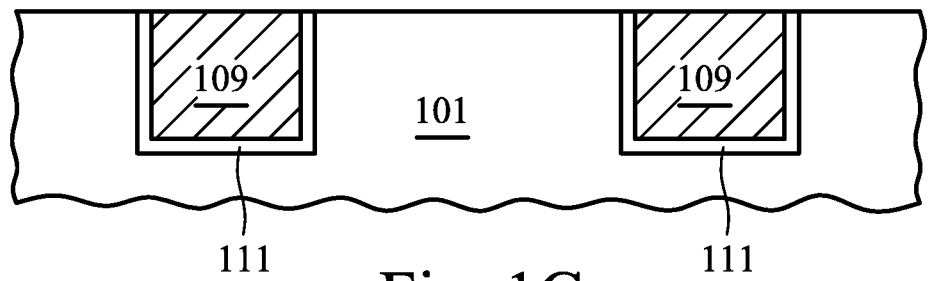

A chemical mechanical polishing (CMP) step may remove conductor overfill, thereby resulting in the planar structure illustrated in FIG. 1C. Following planarization, a portion of the diffusion barrier layer 107 lines the sidewalls of the first 103 and second 105 trenches to form a trench liner 111. The trench liner 111 prevents outward diffusion of the conductor 109 into the surrounding substrate 101.

Figure 1D:
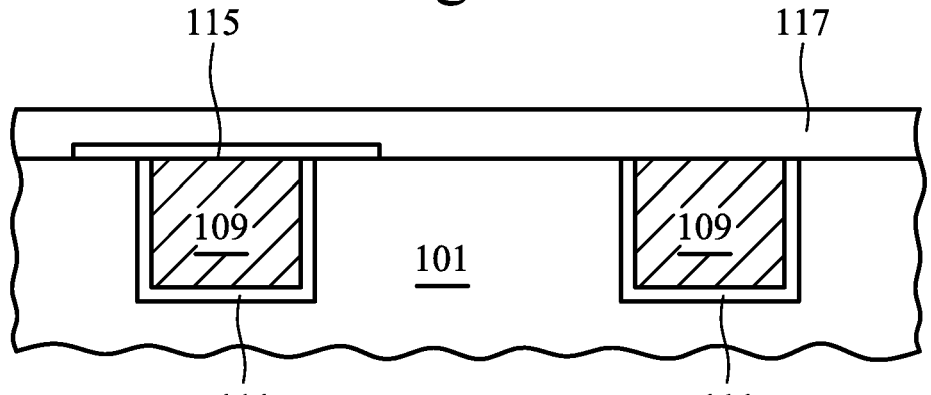

Turning now to FIG. 1D, a patterned layer of conductive material is formed over one of the trenches to form a first capacitor electrode 115. As shown in FIG. 1D, the first capacitor electrode 115 preferably covers and electrically connects the conductor 109 and the trench diffusion barrier liner 111, and may further extends on adjacent portions of the substrate 101. The first capacitor electrode 115 is preferably about 10 to 1500 Å thick and more preferably about 10 to 30 Å thick. It is fabricated using a metal such as TiN, W, Al, Al alloys, or any material that comprises a suitable diffusion barrier material. In preferred embodiments, the trench diffusion barrier liner 111 and the first capacitor electrode 115 comprise the same material.

Next, a first dielectric etch stop layer (ESL) 117 is formed over the substrate 101 including the first capacitor electrode 115, as illustrated in this Figure. Etch stop layer 117 may include, for example, silicon nitride, silicon carbide, and/or silicon oxynitride. In addition to etch control, it also preferably prevents Cu penetration into overlying layers. The ESL 117 is preferably about 500 Å to 1500 Å thick, and it may be applied using PECVD. Preferred embodiments advantageously permit capacitance adjustment by varying the thickness and/or area of electrode 115 and/or ESL 117.

Figure 2A:
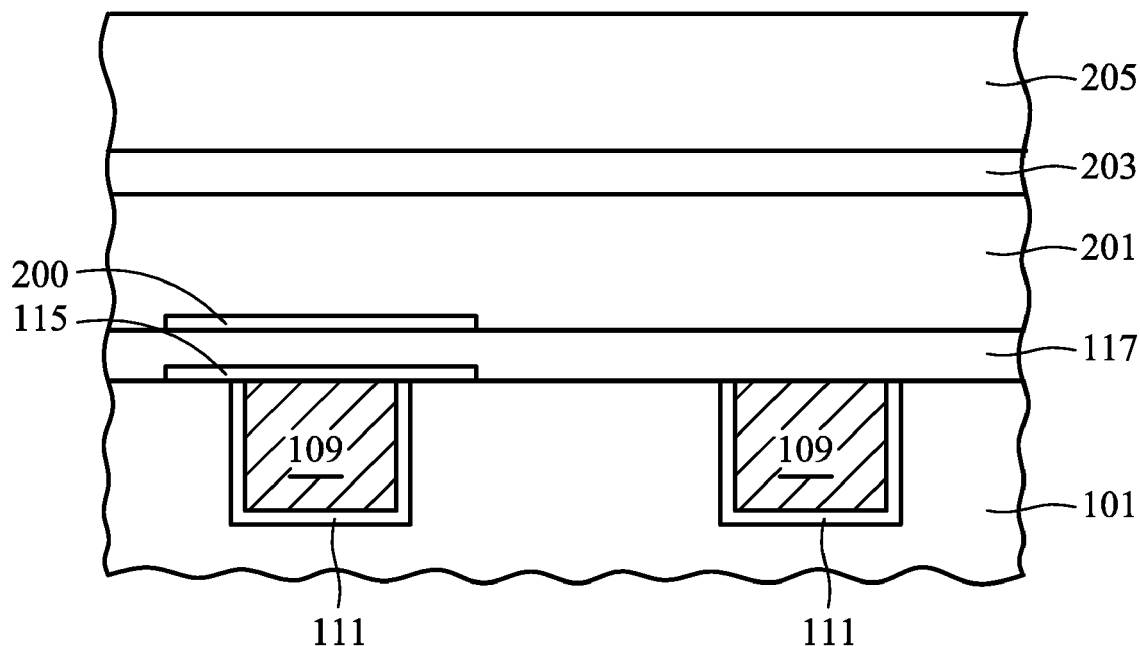
FIGS. 2A, 2B and 2C are cross-sectional views of embodiments of the present invention further including MIM damascene capacitor electrodes and an ESL.

Turning to FIG. 2A, after the step of forming ESL 117, the second (or top) capacitor electrode 200 is formed. The second capacitor electrode 200 preferably includes the same material as the first electrode 115, and its formation may comprise essentially the same deposition and patterning process described above. In preferred embodiments, the top electrode 200 is deposited using the same mask as bottom electrode 115. As illustrated in FIG. 2A, the two capacitor electrodes are preferably essentially parallel and overlapping, that is, second electrode 200 is substantially directly above the first electrode 115.

After forming the second capacitor electrode 200, there is formed a first interlevel dielectric layer 201 (which may also be an inter-metal dielectric layer), a second dielectric etch stop layer 203 and a second interlevel dielectric layer 205. The dielectric etch stop layers 117 and 203 may comprise silicon nitride, silicon carbide, combinations thereof, or any other similar etch stop material. The layers 117, 201, 203, and 205 may be formed by deposition techniques discussed in preceding paragraphs.

The interlevel dielectrics, 201 and 205 may independently comprise silicon dioxide or any other dielectric material known for use in a semiconductor device. Advanced applications frequently employ low-k (i.e. k less than about 4) dielectrics. Suitable low-k dielectrics include, carbon doped silicon dioxide, also referred to as organo silicate glass (OSG) and C-oxide, borophosphosilicate glass (BPSG), borosilicate glass (BSG), phosphosilicate glass (PSG), fluorinated silicate glass (FSG), and porous oxides. Exemplary organic low-k materials include polyarylene ether, hydrogen silsesquioxane (HSQ), methyl silsesquioxane (MSQ), polysilsequioxane, polyimide, benzocyclbbutene, and amorphous Teflon.

Figure 2B:
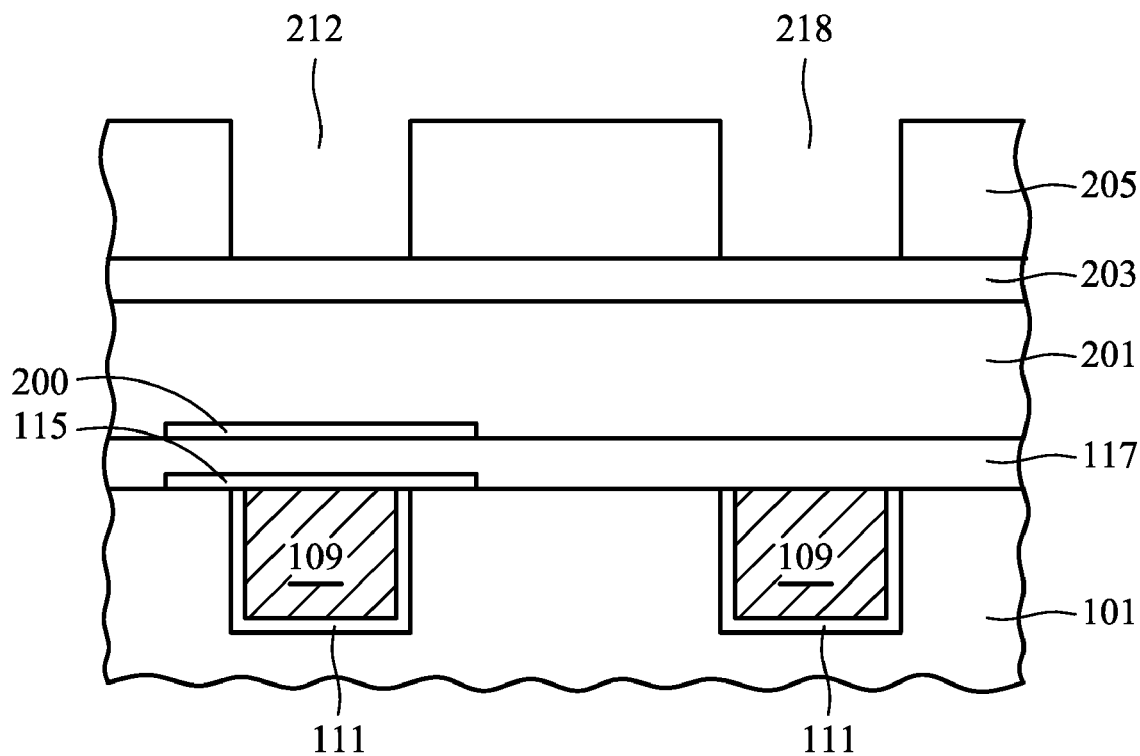
Figure 2C:
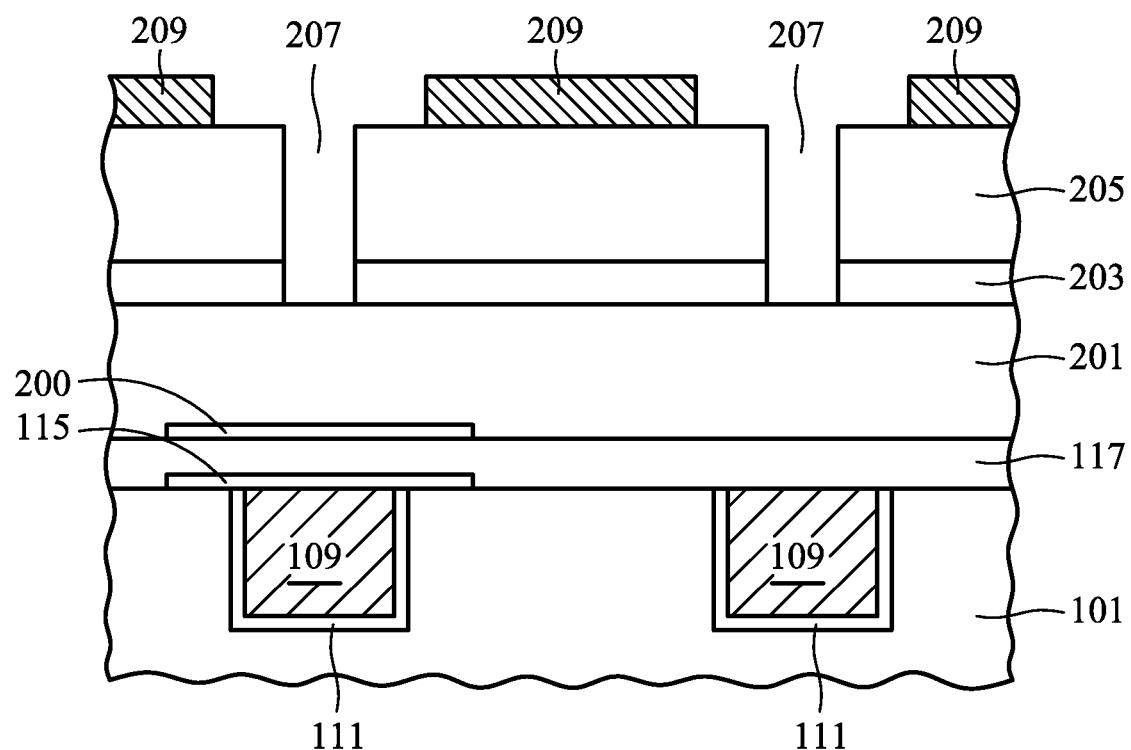
Figure 3:
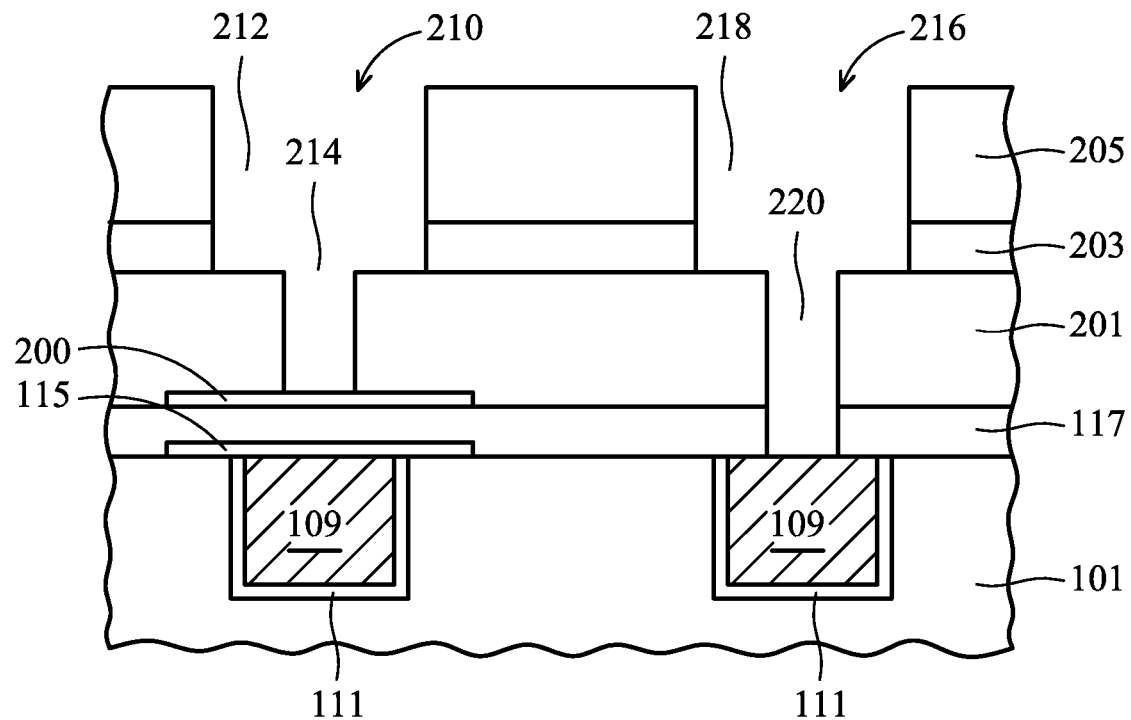
FIG. 3 is a cross sectional view of an embodiment of the present invention further including damascene capacitor electrodes and damascene interconnect openings.

Trench opening and via openings are then formed to expose the second capacitor electrode 200 and conductor, as illustrated in FIGS. 2B, 2C and 3. As is known in the art, either via-first approach or trench-first approach can be used. In the trench-first approach, trenches are formed prior to the formation of vias. As illustrated in FIG. 2B, trenches 212 and 218 are formed. As is known in the art, the formation of trenches 21 and 218 may include applying and patterning a photoresist (not shown), and etching interlevel dielectric layer 205 through the openings. The exposed portions of ESL 203 are then etched, and thus a structure as shown in FIG. 2B is formed.

FIG. 3 illustrates the formation of via openings 214 and 220. A photoresist (not shown) is first formed and patterned, wherein the portions that via openings 214 and 220 are to be formed are exposed. Exposed portions of ESL 203 are removed through trenches 212 and 218. Similar to the formation of trenches 212 and 216, via openings 214 and 220 are formed by forming and patterning a photoresist, and etching interlevel dielectric layer 201. The etching of interlevel dielectric layer 201 preferably uses an etching method with a high ESL-to-oxide etch ratio and a high ESL-to-metal etch ratio. As a result, capacitor electrode 200 is exposed. The exposed portion of ESL 117 is then etched, exposing conductor 109. In subsequent steps, exposed portions of ESL 203 is removed, and thus the structure as shown in FIG. 3 is formed.

In an alternative embodiment, the structure as shown in FIG. 3 is formed using via-first approach, in which vias 214 and 220 are formed by first etching through layers 205, 203, and 201. Trenches 212 and 216 are then formed by etching layers 205 and 203. The exposed portion of ESL 117 is then removed, exposing conductor 109.

FIG. 2C illustrates an alternative embodiment for forming the structure as shown in FIG. 3. After the formation of interlevel dielectric 201, ESL 203 and interlevel dielectric 205, Openings 207 are formed. ESL 203 is exposed through openings 207. Openings 207 are preferably formed with the help of a photoresist (not shown), and preferably have similar sizes (and vertically aligned with) the subsequently formed via openings 214 and 220 (refer to FIG. 3). Hard mask 209 is then formed and patterned according to the desired sizes and locations of trenches 212 and 218 (refer to FIG. 3). ESL 203 is then removed from the bottoms of openings 207, forming structures as shown in FIG. 2C.

Figure 4:
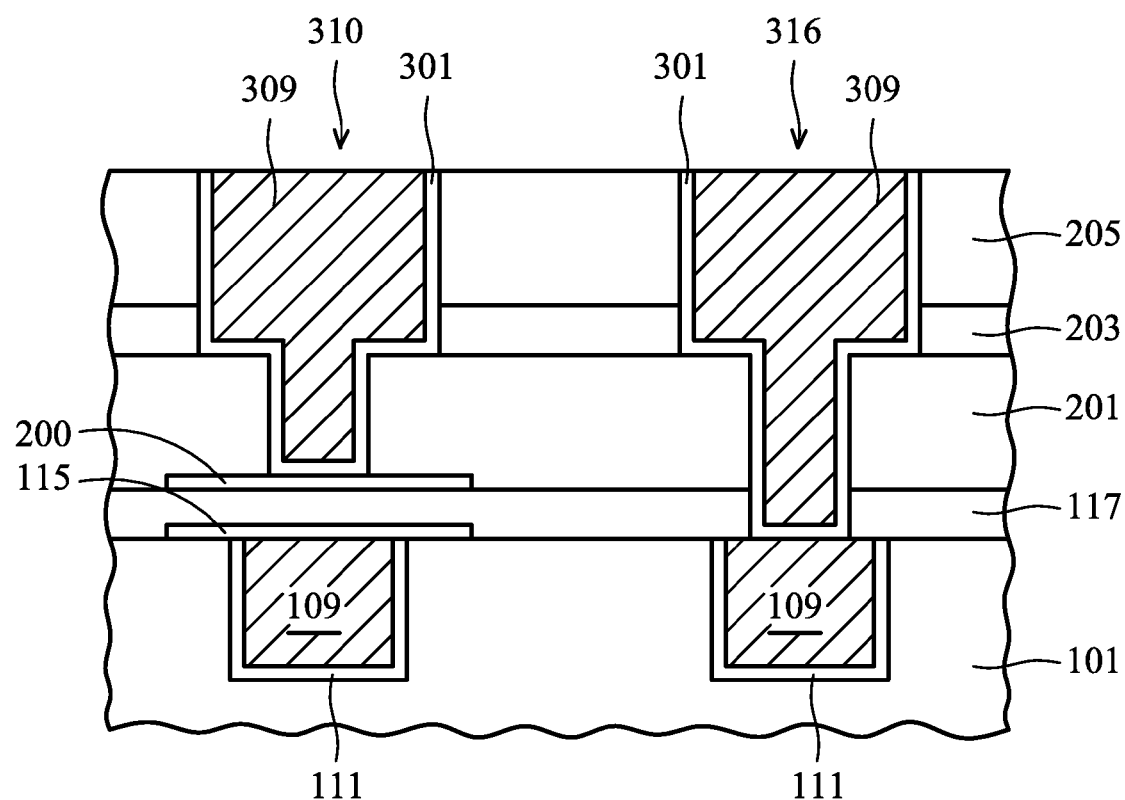
FIG. 4 is a cross sectional view of an embodiment of the present invention illustrating a completed MIM capacitor integrated into the damascene interconnect structure.

Referring to FIG. 3, the portions of interlevel dielectric layer 205 uncovered by photoresist 209 is then anisotropically removed to form damascene trench 212 and primary damascene trench 218. Since interlevel dielectric 201 is also exposed during the removal of interlevel dielectric layer 205, at the same time trenches 212 and 218 are formed, interlevel dielectric layer 203 are also etched, and thus openings 207 extend downward, forming via openings 214 and 220. After the formation of via openings 214 and 220 and trenches 212 and 218, an etching process with a high ESL-to-oxide etch ratio is then performed to remove any uncovered ESL 117 inside damascene opening 220. After the removal of hard mask 209, damascene openings 210 and 216, as shown in FIG. 6, are formed. Turning to FIG. 4, there is illustrated the intermediate device of FIG. 3 after the processing described above and further including forming the completed damascene interconnect structures 310 and 316 according to a preferred embodiment of the invention.

Diffusion barrier layer 301 is preferably deposited within damascene openings 210 and 216 (of FIG. 3) according to the same procedure described above with respect to barrier layer 111. Continuing with FIG. 4, damascene openings are filled with conductor 309. Conductor 309 is preferably copper and is deposited according to the process described above with respect to conductor 109. After CMP planarizing methods described above, the final damascene interconnect structures 310 and 316 shown in FIG. 4 result. As described above, ECD copper may further include a glue and/or a seed layer (not shown).

Figure 5:
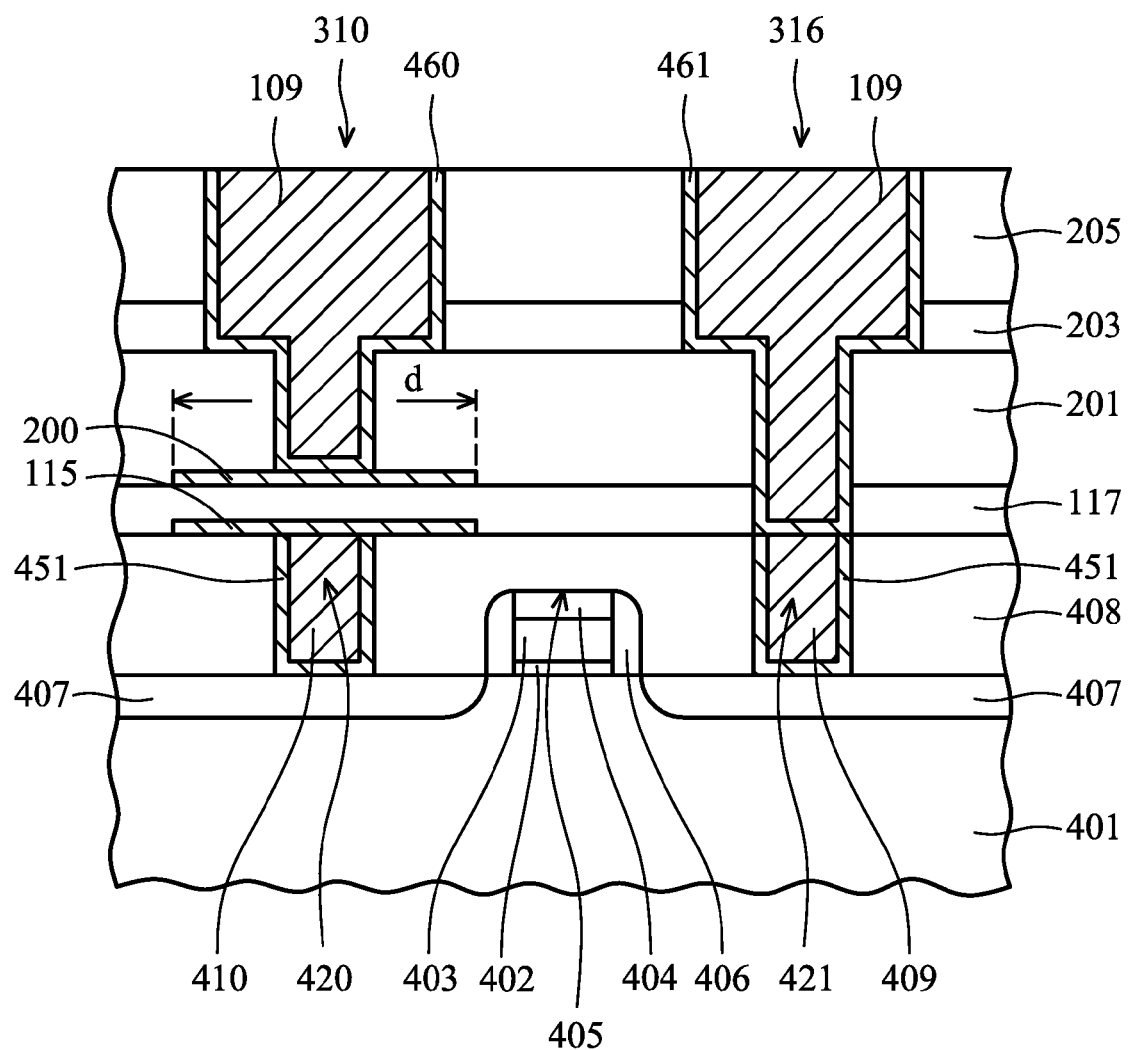
FIG. 5 is a cross sectional view of an embodiment of the present invention illustrating an exemplary DRAM that includes a completed MIM capacitor integrated into the damascene interconnect structure.

Referring now to FIG. 5, there is illustrated an exemplary semiconductor device that incorporates embodiments described herein. It is appreciated that embodiments of this invention have many applications, and one example is used as a DRAM capacitor structure as illustrated in the cross sectional view of FIG. 5.

The method of fabricating a DRAM capacitor structure, featuring a MIM capacitor integrated into the damascene structure, will now be described in detail. Semiconductor substrate 401, comprised of P type, singe crystalline silicon, featuring a <100> crystallographic orientation, is used and schematically shown in FIG. 5. Silicon dioxide gate insulator layer 402 is thermally grown to a thickness between about 15 to 100 Angstroms, followed by the formation of silicon nitride capped, polycide gate structure 405. Polycide layer 403, is comprised of an overlying metal silicide layer such as tungsten silicide, and an underlying, in situ doped, polysilicon layer 403. The underlying polysilicon layer is obtained via low pressure chemical vapor deposition (LPCVD), procedures, at a thickness between about 200 to 2000 Angstroms, and doped during deposition via the addition of arsine or phosphine, to a silane ambient. It is to be noted that although the gate structure is referred to as polycide gate structure 405 throughout the description, the gate electrode may be formed of other commonly used materials, such as metals, metal nitrides, and combinations thereof. The overlying tungsten silicide layer is also obtained via LPCVD procedures, at a thickness between about 200 to 2000 Angstroms, using silane and tungsten hexafluoride as reactants. Silicon nitride layer 404, is then deposited at a thickness between about 100 to 1000 Angstroms, via LPCVD or plasma enhanced chemical vapor deposition (PECVD) procedures. A photoresist shape, not shown in the drawings, is used as an mask to allow an anisotropic, reactive ion etching (RIE) procedure, using $Cl_2$ as an etchant, to define silicon nitride capped, polycide gate structure 405, shown schematically in FIG. 5. The width of silicon nitride capped, polycide gate structure 405, is between about 100 to 1000 Angstroms.

After removal of the photoresist shape used for definition of the silicon nitride capped, polycide gate structure, via plasma oxygen ashing procedures, insulator spacers 406, on formed on the sides of silicon nitride capped, polycide gate structure 405. This is accomplished via deposition of a silicon nitride, or a silicon oxide layer, via LPCVD or PECVD procedures, at a thickness between about 100 to 1500 Angstroms. An anisotropic RIE procedure, using $CF_4$ as an etchant is next used to form silicon nitride, or silicon oxide spacers on the sides of silicon nitride capped, polycide gate structure 405. Arsenic or phosphorous ions are next implanted into a region of semiconductor substrate 401, not covered by silicon nitride capped, polycide gate structure 405, or by insulator spacers 406, at an energy between about 2 to 100 KeV, at a dose between about 2E13 to 7E14 atoms/cm. An anneal procedure is next performed using either conventional furnace or rapid thermal anneal procedures, to activate the implanted ions, forming N type source/drain region 407, shown schematically in FIG. 5. Although this invention is described for a N channel device, it can also be applied to a P channel device.

A dielectric layer 408, which may be an interlevel dielectric layer, is next deposited at a thickness between about 3000 to 12000 Angstroms, via LPCVD or PECVD procedures. Dielectric layer 408 may be formed of silicon oxide, boron doped phosphosilicate glass (BPSG), or other IMD or ILD materials. Planarization of dielectric layer 408, is then accomplished via a chemical mechanical polishing (CMP) procedure, resulting in a smooth top surface topography for dielectric layer 408. Photolithographic and anisotropic RIE procedures, using $CHF_3$ as an etchant, are used to define trench openings 420, and 421 within dielectric layer 408, so the trench openings now expose a top portion of source/drain regions 407. After removal of the photoresist shape used to define openings 420, and 421, a trench barrier liner 451 is formed.

Following forming liner 451, a conductor, preferably copper, is deposited at a thickness between about 3000 to 12000 Angstroms, thereby completely filling trench openings 420, and 421. Regions of unwanted copper located on the top surface of dielectric layer 408 may be using CMP, thereby defining lower copper storage node plug structure 410, in opening 421, and copper bit line plug structure 409, located in opening 420.

In accordance with preferred embodiments describe above, the first electrode 115 is formed by deposited a barrier layer material that is subsequently patterned as shown in FIG. 5. First electrode 115 is preferably the same liner material 451 used to line openings 420 and 421. The integrated MIM damascene capacitor fabrication is next completed as described above. In accordance with preferred embodiments, damascene liners 460 and 461, trench liners 450 and 451, the first capacitor electrode 115, and the second capacitor electrode 200 all comprise barrier material.

By way of further example, and as illustrated in FIG. 5, the lateral dimension of the damascene electrodes d is larger than the width of the gate structure 405. In fact, as shown in FIG. 5, the capacitor electrode size d is larger than the via portion of the damascene interconnect structure 310. The lateral dimension d is limited by device density, but it is preferably at least as wide as the maximum damascene opening, typically the trench in a same semiconductor chip.

The capacitor electrode geometry parameter d illustrates an advantage that embodiments have over certain conventional damascene capacitors. Capacitor electrodes 115 and 200 are not constrained by the lateral geometry of their attached conductive interconnects. For example, in a conventional damascene capacitor, the capacitor structure may consist only of damascene interconnect 310, substrate interconnect 420, and dielectric 117. The addition of capacitor electrodes 115 and 200 according to embodiments described herein, enable a flexibility in integrated circuit design not possible with conventional methods and structures. The ability to adjust the electrode geometry parameter d independently of interconnect geometry permits a wider range of capacitance values than that achievable with conventional damascene capacitors.

While the previous example illustrated a damascene MIM capacitor linked with a DRAM, embodiments are easily linked with other devices at any other level, including the silicon substrate. Several other advantages are summarized below.

Preferred embodiments are economically manufactured because the MIM electrode fabrication process requires only one additional, photolithography process to form the capacitor plates. Furthermore, since the electrode dimensions are relatively much larger compared to a FET, the photolithography process is simple and straightforward. Embodiments also advantageously rely on etch selectivity between the plate material and ESL thereby eliminating the conventional etching required to contact the capacitor top plate. Embodiments also eliminate the high leakage levels associated with high capacitance, dense Si capacitors having an ultra thin gate oxide. Embodiments easily provide for adjustment of capacitance density by varying the lower plate thickness during deposition. For decoupling applications, capacitor formation is expected to have a sufficiently wide process window to translate into increased production yield.

Although the present invention and its advantages have been described in detail, it should be understood that various changes, substitutions and alterations can be made herein without departing from the spirit and scope of the invention as defined by the appended claims the embodiments of the invention described above are exemplary and not limiting, and variations that are apparent to those skilled in the art that include the features of the invention are within the scope of the invention and the appended claims.

What is claimed is:

1. A semiconductor device, comprising:
   a first damascene interconnect structure comprising:
      a conductive via formed through a first interlevel dielectric layer and a first dielectric etch stop layer located under the first interlevel dielectric layer, wherein the conductive via contacts a first interconnect structure located under the first dielectric etch stop layer; and
      a conductive trench formed through a second interlevel dielectric layer and a second dielectric etch stop layer located between the first and second interlevel dielectric layers, wherein the conductive trench contacts the conductive via; and
   a metal-insulator-metal capacitor comprising:
      a first plate electrode formed on a second interconnect structure located under the first dielectric etch stop layer;
      a second plate electrode formed on the first dielectric etch stop layer and substantially overlapping the first plate electrode; and
      a second damascene interconnect structure formed through the first and second interlevel dielectric layers and the second dielectric etch stop layer and contacting the second plate electrode.

2. The semiconductor device of claim 1, wherein the first and second plate electrodes comprise a same material as diffusion barriers of the conductive via and conductive trench.

3. The semiconductor device of claim 2, wherein the diffusion barrier comprises a material selected from the group consisting essentially of TiN, W, Al, Al alloys, TbN, VN, ZrN, CrN, WC, WN, WCN, NbN, AlN, Ni, Co, AlCu alloys, TaN, Ti, Ta, Ra, Ru, and combinations thereof.

4. The semiconductor device of claim 1, wherein the first interlevel dielectric layer and the second interlevel dielectric layer comprise a material selected from the group consisting essentially of silicon oxide, silicon nitride, silicon carbide, organo silicate glass (OSG), borophosphosilicate glass (BPSG), borosilicate glass (BSG), phosphosilicate glass (PSG), fluorinated silicate glass (FSG), a porous oxides, polyarylene ether, hydrogen silesquioxane (HSQ), methyl silsesquioxane (MSQ), polysilsequioxane, polyimide, benzocyclbbutene, and combinations thereof.

5. The semiconductor device of claim 1, wherein the first and second damascene interconnect structures are dual damascene interconnect structures.

6. The semiconductor device of claim 1 further comprising:
   a barrier liner between the first damascene interconnect structures and the first and second interlevel dielectric layers.

7. The semiconductor device of claim 6, wherein the barrier liner comprises a material selected from the group consisting essentially of TiN, W, Al, Al alloys, TbN, VN, ZrN, CrN, WC, WN, WCN, NbN, AlN, Ni, Co, AlCu alloys, TaN, Ti, Ta, Ra, Ru, and combinations thereof.

8. The semiconductor device of claim 1, wherein the first plate electrode and the second plate electrode have a maximum dimension greater than or equal to a maximum lateral damascene trench dimension.

9. A semiconductor device, comprising:
   a first interlevel conductive via formed through an interlevel dielectric layer and a dielectric etch stop layer located under the interlevel dielectric layer and contacting a first interconnect structure located under the dielectric etch stop layer; and
   a metal-insulator-metal capacitor comprising:
      a first plate electrode formed on a second interconnect structure, the second interconnect structure located under the dielectric etch stop layer;
      a second plate electrode formed on the dielectric etch stop layer, the second plate electrode being substantially parallel to the first plate electrode and substantially overlapping the first plate electrode; and
      a second interlevel conductive via formed through the interlevel dielectric layer and contacting the second plate electrode.

10. The semiconductor device of claim 9, wherein the first plate electrode extends from a bottom surface of the dielectric etch stop layer into the dielectric etch stop layer.

11. The semiconductor device of claim 10, wherein the diffusion barrier comprises a material selected from the group consisting essentially of TiN, W, Al, Al alloys, TbN, VN, ZrN, CrN, WC, WN, WCN, NbN, AlN, Ni, Co, AlCu alloys, TaN, Ti, Ta, Ra, Ru, and combinations thereof.

12. The semiconductor device of claim 9, wherein the first and second interlevel conductive vias each further includes a barrier liner.

13. The semiconductor device of claim 12, wherein the barrier liner comprises a material selected from the group consisting essentially of TiN, W, Al, Al alloys, TbN, VN, ZrN, CrN, WC, WN, WCN, NbN, AlN, Ni, Co, AlCu alloys, TaN, TiN, Ti, Ta, Ra, Ru, and combinations thereof.

14. The semiconductor device of claim 9, wherein the first plate electrode and the second plate electrode have a maximum dimension greater than or equal to a maximum lateral second interlevel conductive via dimension in a same semiconductor chip.

15. The semiconductor device of claim 9, wherein the interlevel dielectric layer comprises a material selected from the group consisting essentially of silicon oxide, silicon nitride, silicon carbide, organo silicate glass (OSG), borophosphosilicate glass (BPSG), borosilicate glass (BSG), phosphosilicate glass (PSG), fluorinated silicate glass (FSG), a porous oxides, polyarylene ether, hydrogen silesquioxane (HSQ), methyl silsesquioxane (MSQ), polysilsequioxane, polyimide, benzocyclbbutene, and combinations thereof.

* * * * *

UNITED STATES PATENT AND TRADEMARK OFFICE
CERTIFICATE OF CORRECTION

PATENT NO. : 7,768,099 B2
APPLICATION NO. : 11/525232
DATED : August 3, 2010
INVENTOR(S) : Oates et al.

It is certified that error appears in the above-identified patent and that said Letters Patent is hereby corrected as shown below:

In Col. 10, line 1, claim 4, delete "silesquioxane" and insert --silsesquioxane--.
In Col. 10, line 2, claim 4, delete "polysilsequioxane" and insert --polysilsesquioxane--.
In Col. 10, lines 2-3, claim 4, delete "benzocyclbbutene" and insert --benzocyclobutene--.
In Col. 10, line 62, claim 15, delete "silesquioxane" and insert --silsesquioxane--.
In Col. 10, line 63, claim 15, delete "polysilsequioxane" and insert --polysilsesquioxane--.
In Col. 10, line 64, claim 15, delete "benzocyclbbutene" and insert --benzocyclobutene--.

Signed and Sealed this

Seventh Day of September, 2010

David J. Kappos
*Director of the United States Patent and Trademark Office*